(12) United States Patent
Wu et al.

(10) Patent No.: US 12,733,130 B2
(45) Date of Patent: Sep. 8, 2026

(54) JOINT MODULE, SERVER, AND COMPUTING SYSTEM

(71) Applicant: Fulian Precision Electronics (Tianjin) Co., LTD., Tianjin (CN)

(72) Inventors: Chang-Ju Wu, New Taipei (TW); Chih-Min Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 282 days.

(21) Appl. No.: 18/666,584

(22) Filed: May 16, 2024

(65) Prior Publication Data

US 2025/0016955 A1 Jan. 9, 2025

(30) Foreign Application Priority Data

Jul. 6, 2023 (CN) ......................... 202310828438.8

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
CPC ........... H05K 7/20272; H05K 7/20781; H05K 7/20772; G06F 1/183; G06F 1/20
See application file for complete search history.

(56) References Cited

U.S. PATENT DOCUMENTS 4,139,222 A * 2/1979 Loland .................. F16L 33/221 285/12
11,692,643 B1 * 7/2023 Chen ....................... F16K 35/14 137/383
2022/0136628 A1 * 5/2022 Li ....................... F16L 19/0212 285/19
2022/0418158 A1 12/2022 Gao

* cited by examiner

*Primary Examiner* — James M Hewitt, II
(74) *Attorney, Agent, or Firm* — ScienBiziP, P.C.

(57) ABSTRACT

A joint module for cutting coolant circuit in server comprises a shell, a moving piece, a rotating piece, a driving piece, and a plug connector. The moving piece is movable in the shell between a first position and a second position. The rotating piece is rotatable in the shell between a first angle and a second angle. The driving piece is located on the shell and is used for rotating the rotating piece. The plug connector is located on the moving piece and is used for connecting a plug. When the driving piece rotates the rotating piece from the first angle to the second angle, the moving piece moves from the first position to the second position, the plug connector moves towards the shell and disconnects the plug. A server and a computing system with the joint module is also disclosed.

20 Claims, 5 Drawing Sheets

JOINT MODULE, SERVER, AND COMPUTING SYSTEM

FIELD

The disclosure herein generally relates to information computing systems, and more particularly relates to a joint module, a server, and a computing system.

BACKGROUND

A server is installed in a rack, a plug connector is locked on a backside of the server and is connected to a plug on the rack. Coolant can flow through the plug of the server and the plug of the rack to cool the server. The coolant may be leaked from the connection between the plug of the server and the plug of the rack, and a risk of damaging the server for the leakage of the coolant.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
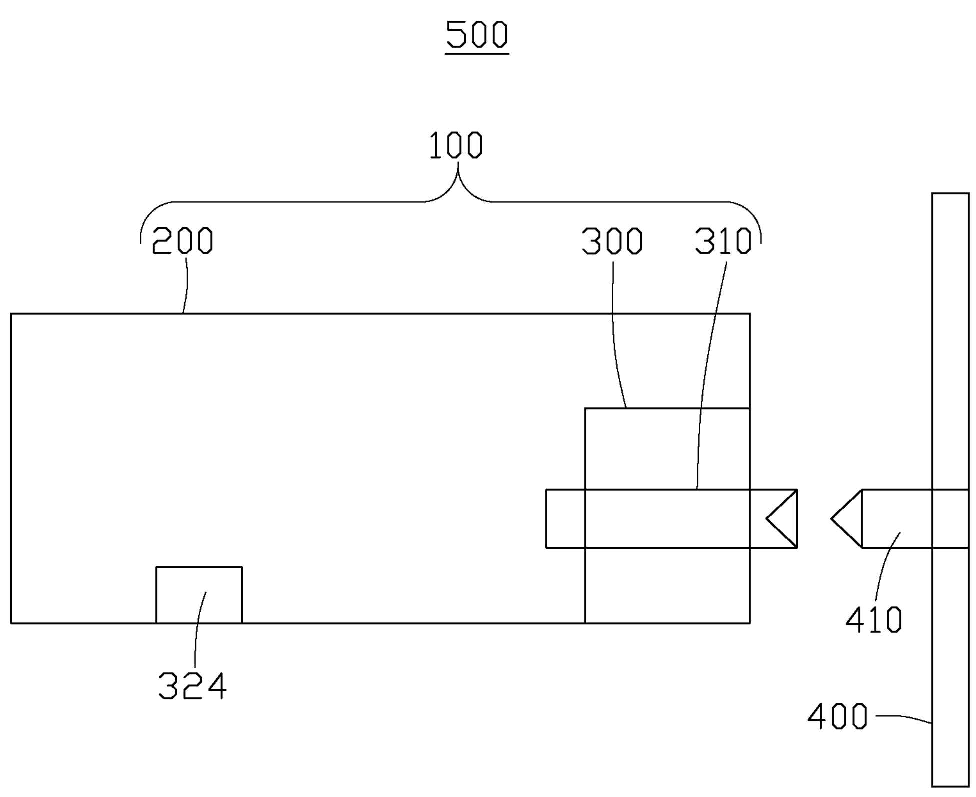
FIG. 1 is a diagram view of an embodiment of a computing system according to the present disclosure.
Figure 2:
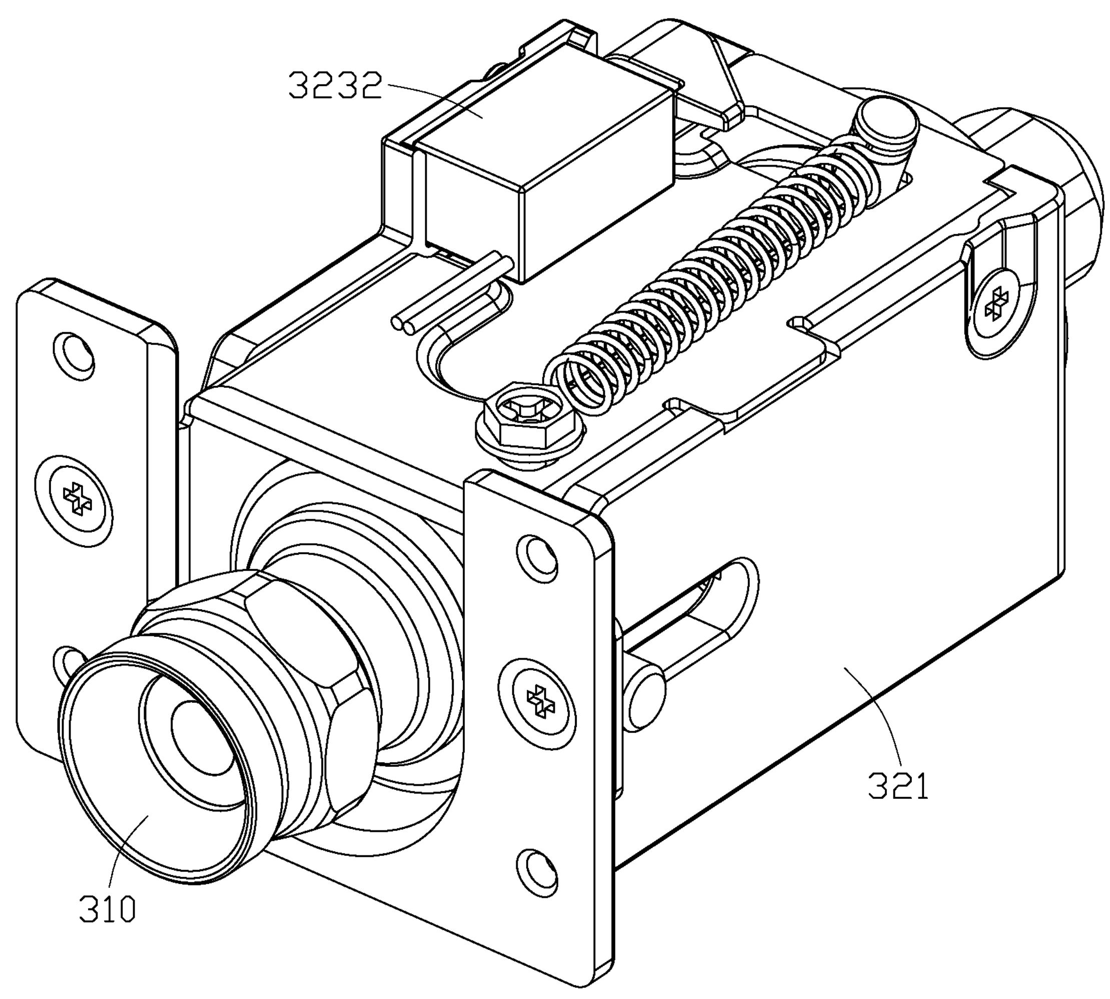
FIG. 2 is an isometric view of an embodiment of a joint module according to the present disclosure.
Figure 3:
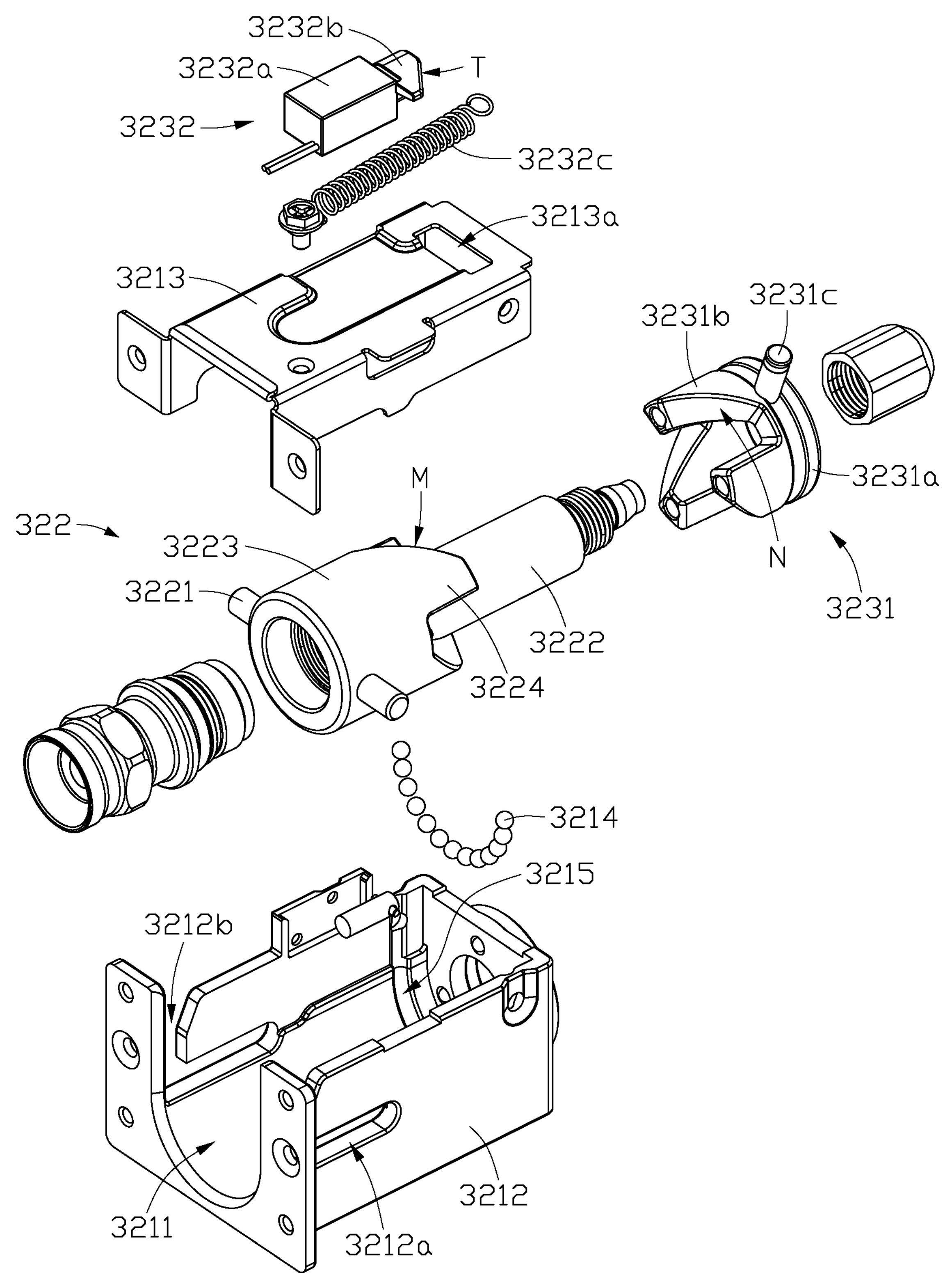
FIG. 3 is an explored view of the joint module shown in FIG. 2.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

When a server is installed in a rack, a plug connector behind the server is connected to a plug on the rack, so that the rack can provide coolant to the server to cool the server. However, there is a risk of coolant leakage, and when the coolant leak in the server, if the coolant circuit is not cut in time, a large amount of coolant will enter the server, causing damage to the server.

As shown in FIG. 1 to FIG. 5, a computing system 500 in an embodiment includes a rack 400 and a plurality of servers 100. The plurality of servers 100 can be installed into the rack 400 in layers. The rack 400 includes a plurality of plugs 410, and there is at least one plug 410 in each layer. Each server 100 has a plug connector 310 in the back. When one of the plurality of servers 100 is installed into the rack 400, the plug connector 310 needs to be connected to the plug 410 in the same layer, so that the rack 400 can provide coolant to the server 100 to cool the server 100. Usually, there are two plugs 410 in each layer in the rack 400, and there are two plug connectors 310 in the back of each server 100, when the server 100 is installed into the rack 400, the two plug connectors 310 are connected to the two plugs 410 one-to-one, so that the coolant can be circulated between the server 100 and the rack 400.

However, there is a risk of coolant leakage, and when the coolant leak in the server 100, if the coolant circuit is not cut in time, the coolant will enter the server 100, causing damage to the server 100.

As shown in FIG. 1, in some embodiments, to solve the problem mentioned above, the server 100 in an embodiment includes a chassis 200, a sensor 324, and a joint module 300. The joint module 300 and the sensor 324 is located on the chassis 200. The sensor 324 is configured for sensing the coolant leakage in the server 100, if there is any coolant leakage, the sensor 324 send signal so that the joint module 300 disconnects the plug connectors 310 with the plug 410, to cut the coolant circuit for protecting the server 100.

Figure 4:
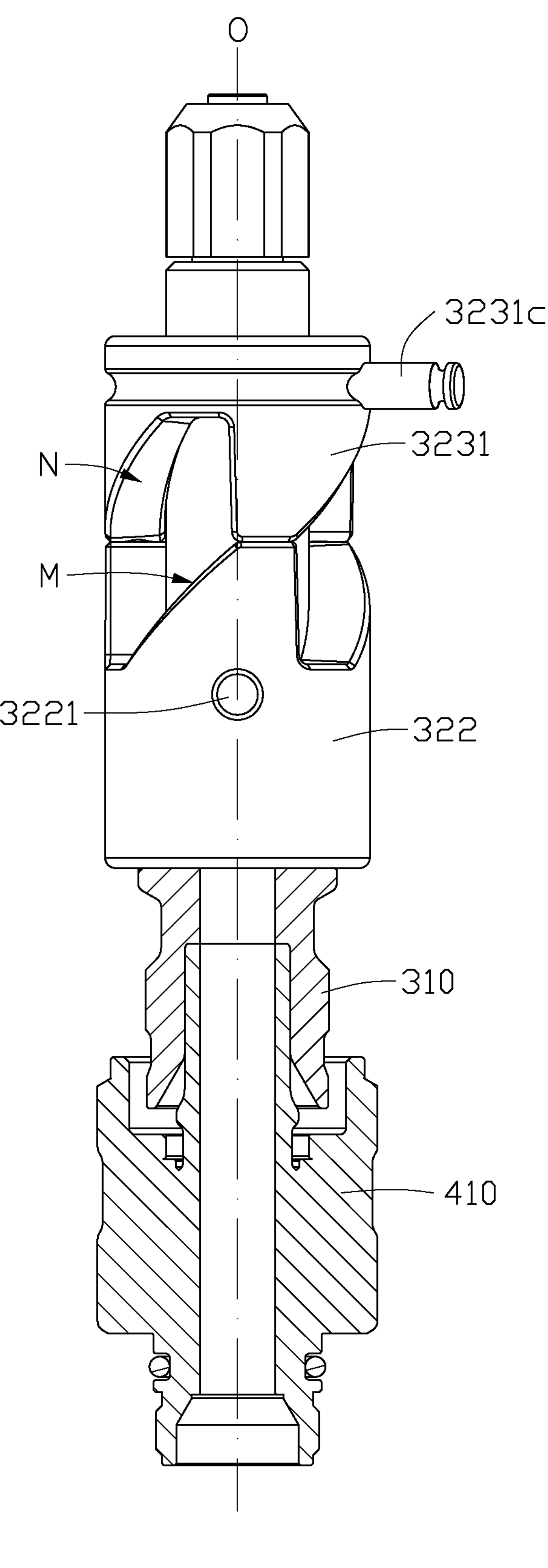
FIG. 4 is a top view of the joint module shown in FIG. 2, showing a plug connector connected with a plug.
Figure 5:
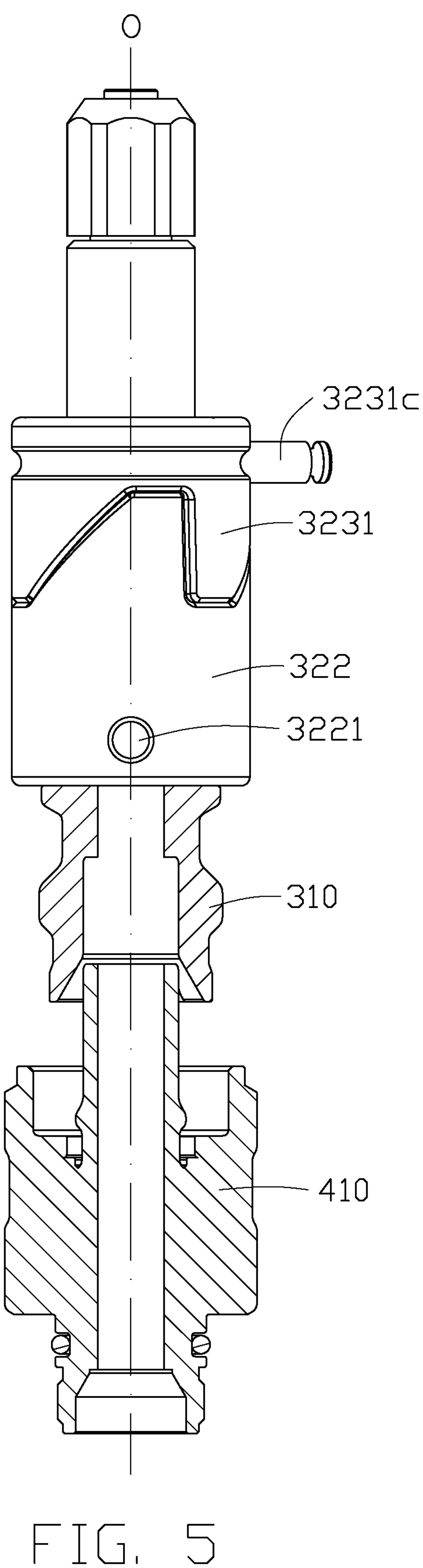
FIG. 5 is a top view of the joint module shown in FIG. 2, showing a plug connector disconnected with a plug.

As shown in FIG. 1 to FIG. 5, in some embodiments, the joint module 300 in an embodiment includes a shell 321, a moving piece 322, a rotating piece 3231, a driving piece 3232, and a plug connector 310. The plug connector 310 is installed on the moving piece 322. The shell 321 has a cavity 3211. The moving piece 322 is partially located in the cavity 3211. The moving piece 322 has an axis O, and the moving piece 322 is movable along the axis O between a first position and a second position. The rotating piece 3231 is placed in the cavity 3211. The rotating piece 3231 has an axis O, and the rotating piece 3231 is rotatable around the axis O between a first angle and a second angle. The driving piece 3232 is located on the shell 321 and is connected to the rotating piece 3231. The driving piece 3232 can rotate the rotating piece 3231 from the first angle to the second angle. When the rotating piece 3231 stays at the first angle, the moving piece 322 is on the first position, and the plug connector 310 is connected to the plug 410, as shown in FIG. 4. When the rotating piece 3231 is rotated to the second angle, the moving piece 322 is allowed to move to the second position, and after the moving piece 322 moves to the second position, the plug connector 310 is disconnected with the plug 410, as shown in FIG. 5.

In some embodiments, when the rotating piece 3231 is rotated to the second angle, the moving piece 322 moves to the second position by the pressure of the coolant, or the moving piece 322 moves to the second position by a spring (not shown in FIGS.).

In some embodiments, the shell 321 includes a base 3212 and a cover 3213. The cavity 3211 is formed between the cover 3213 and the base 3212. Since the base 3212 is the main stress-bearing part, the base 3212 is made of a whole piece of metal through milling processing, thereby improving the structural strength of the base 3212. The cover 3213 is sheet metal, reducing the processing cost of the cover 3213.

In some embodiments, the base 3212 has two grooves 3212*a* on both sides in the direction perpendicular to the axis O. The two grooves 3212*a* extend in a direction parallel to the axis O. The moving piece 322 includes two pins 3221 on both sides in the direction perpendicular to the axis O. Each of the two pins 3221 is slidably located in each of the two grooves 3212*a*. The grooves 3212*a* limit the pins 3221, so that the moving piece 322 slide along the axis O.

In some embodiments, a length of the pin 3221 is less than a width of the groove 3212*a*, so the pin 3221 is located within the groove 3212*a*, thereby reducing the risk of the pin 3221 interfering with other components during the sliding of the moving piece 322.

In some embodiments, the base 3212 further has an opening 3212*b* on one side, and the opening 3212*b* is perpendicular to the groove 3212*a* and is connected to the groove 3212*a*. The pins 3221 enter the grooves 3212*a* by the opening 3212*b*, facilitating the assembly of moving piece 322 and the base 3212.

In some embodiments, the moving piece 322 further includes a plurality of first teeth 3224, and the rotating piece 3231 includes a plurality of second teeth 3231*b*. The space between each two adjacent second teeth 3231*b* can accommodate one first tooth 3224, and the space between each two adjacent first teeth 3224 can accommodate one second tooth 3231*b*. When the moving piece 322 is on the first position and the rotating piece 3231 is at the first angle, each of the plurality of first teeth 3224 is against each of the plurality of second teeth 3231*b*, the second teeth 3231*b* stop the first teeth 3224, so the rotating piece 3231 stop the moving piece 322 from moving to the second position, to keep the plug connector 310 connected with the plug 410, as shown in FIG. 4. When the rotating piece 3231 is at the second angle, the second teeth 3231*b* are not against the first teeth 3224, so the moving piece 322 is allowed to move towards the rotating piece 3231, until the second teeth 3231*b* and the first teeth 3224 are engaged, and at this time, the moving piece 322 is on the second position and the plug connector 310 is disconnected with the plug 410, as shown in FIG. 5.

In some embodiments, there are three second teeth 3231*b* and three first teeth 3224.

In some embodiments, the end of the second teeth 3231*b* facing the first teeth 3224 is provided with a buffer pad (not shown in FIGS.), to buffer the impact force between the second teeth 3231 and the first teeth 3224.

In some embodiments, the moving piece 322 further includes a shaft 3222 and a head 3223. The rotating piece 3231 further includes a ring 3231*a*. The pins 3221 are located on the head 3223. The plug connector 310 is installed on the head 3223. The head 3223 is located on an end of the shaft 3222 in the cavity 3211, and another end of the shaft 3222 away from the head 3223 passes through the ring 3231*a*, so the ring 3231*a* rotates around the shaft 3222 between the first angle and the second angle. The inner surface of the cavity 3211 matches the outer surface of the head 3223, to support the head 3223. The first teeth 3224 are located on the head 3223 toward the ring 3231*a*, and the second teeth 3231*b* are located on the ring 3231*a* towards the head 3223.

In some embodiments, the shell 321 further includes a plurality of balls 3214. The outer peripheral surface of the rotating piece 3231 and the inner surface of the cavity 3211 are provided with ball grooves 3215, the balls 3214 are placed in the ball grooves 3215, and the balls 3214 are used to reduce the friction between the ring 3231*a* and the shell 321.

In some embodiments, the rotating piece 3231 further includes a trigger lever 3231*c*. The cover 3213 has an avoiding hole 3213*a*, the trigger lever 3231*c* is located on the ring 3231*a* and extends along a radial direction of the ring 3231*a* out of the cavity 3211 through the avoiding hole 3213*a*. The driving piece 3232 includes an electromagnetic valve 3232*a* and a pushing part 3232*b*. The electromagnetic valve 3232*a* is placed on the outer surface of the cover 3213. The electromagnetic valve 3232*a* is used for moving the pushing part 3232*b* along a direction parallel to axis O. The pushing part 3232*b* is used for pushing the trigger lever 3231*c* to rotate the ring 3231*a* from the first angle to the second angle.

Furthermore, the driving piece 3232 further includes a spring 3232*c*, the spring 3232*c* is located out of the cavity 3211, and the spring 3232*c* connects the trigger lever 3231*c* and the shell 321. The pushing part 3232*b* can only push the trigger lever 3231*c* to a critical angle between the first angle and the second angle, after the trigger lever 3231*c* is pushed at the critical angle, the spring 3232*c* pulls the trigger lever 3231*c* to rotate the ring 3231*a* from the critical angle to the second angle. When the ring 3231*a* is at the first angle, the spring 3232*c* cannot pull the trigger lever 3231*c* to rotate the ring 3231*a* to the second angle, because the spring 3232*c* can only pull the trigger lever 3231*c* when the ring 3231*a* is at the critical angle.

The pushing part 3232*b* has a bevel T, the bevel T is used for pushing the trigger lever 3231*c* during the movement of the pushing part 3232*b*, to push the trigger lever 3231*c* from the first angle to the critical angle.

In some embodiments, each first teeth 3224 has a first arc surface M, each second teeth 3231*b* has a second arc surface N. When the rotating piece 3231 is at the second angle, the first arc surfaces M and the second arc surfaces N can guide the first teeth 3224 and the second teeth 3231*b* to engage, until the moving piece 322 moves to the second position, avoid the first teeth 3224 and the second teeth 3231*b* getting stuck due to angle error of rotation of the rotating piece 3231.

When the sensor 324 detects that there is coolant leakage in the server 100, the sensor 324 sends a leakage signal to the electromagnetic valve 3232*a*, and the electromagnetic valve 3232*a* moves the pushing part 3232*b* to push the trigger lever 3231*c*, until the ring 3231*a* rotates to the second angle, the second teeth 3231*b* and the first teeth 3224 engage to each other (under the pressure of coolant for example), so the plug connector 310 is disconnected with the plug 410, cutting the circuit of coolant for the server 100.

When resetting the joint module 300, manually pulling the moving piece 322 to separate the first teeth 3224 and the second teeth 3231*b*, then manually rotating the trigger lever 3231*c* to rotate the ring 3231*a* back to the first angle, to let the first teeth 3224 and the second teeth 3231*b* are against to each other, so the plug connector 310 can connect to the plug 410.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A joint module comprising:

a shell defining a cavity;

a moving piece located in the cavity and movable along an axis of the moving piece between a first position and a second position;

a rotating piece located in the cavity and rotatable around an axis of the rotating piece between a first angle and a second angle, the axis of the rotating piece being parallel to the axis of the moving piece;

a driving piece located on the shell and configured for rotating the rotating piece; and a plug connector located on the moving piece and configured for connecting a plug, wherein when the driving piece rotates the rotating piece from the first angle to the second angle, the moving piece moves from the first position to the second position, the plug connector moves towards the shell and disconnects the plug.

2. The joint module of claim 1, wherein the shell comprises a base and a cover, the cover is removably installed on the base, the cavity is formed between the cover and the base, the base defines at least one groove parallel to the axis of the moving piece, the moving piece comprises at least one pin, each of the at least one pin is slidably located in each of the at least one groove.

3. The joint module of claim 2, wherein the base further defines an opening, the opening is connected to one of the at least one groove.

4. The joint module of claim 1, wherein the moving piece comprises a plurality of first teeth, the rotating piece comprises a plurality of second teeth, when the moving piece is on the first position and the rotating piece is at the first angle, each of the plurality of first teeth is against each of the plurality of second teeth, when the moving piece is on the second position and the rotating piece is at the second angle, the plurality of first teeth and the plurality of second teeth are engaged.

5. The joint module of claim 4, wherein the moving piece further comprises a shaft and a head, the rotating piece further comprises a ring, the head is located on an end of the shaft in the cavity and is configured for connecting the plug, another end of the shaft away from the head passes through the ring, the ring rotates around the shaft between the first angle and the second angle, the plurality of first teeth are located on the head toward the ring, the plurality of second teeth are located on the ring towards the head.

6. The joint module of claim 5, wherein the rotating piece further comprises a plurality of balls, the plurality of balls are arranged around the ring and are located between the shell and the ring.

7. The joint module of claim 5, wherein the rotating piece further comprises a trigger lever, the shell defines an avoiding hole, the trigger lever is located on the ring and extends along a radial direction of the ring out of the cavity through the avoiding hole, the driving piece comprises a pushing part, the pushing part is configured for pushing the trigger lever to rotate the ring from the first angle to the second angle.

8. The joint module of claim 7, wherein the driving piece further comprises a spring, the spring is located out of the cavity, the spring connects the trigger lever and the shell, the pushing part is configured for pushing the trigger lever to a critical angle between the first angle and the second angle, after the trigger lever is pushed at the critical angle, the spring pulls the trigger lever to rotate the ring from the critical angle to the second angle.

9. The joint module of claim 8, wherein the pushing part defines a bevel, the pushing part moves along the axis of the moving part, the bevel is configured for pushing the trigger lever during the movement of the pushing part, to push the trigger lever from the first angle to the critical angle.

10. The joint module of claim 4, wherein each of the plurality of first teeth defines a first arc surface, each of the plurality of second teeth defines a second arc surface, when the rotating piece is at the second angle, the first arc surfaces and the second arc surfaces guide the plurality of first teeth and the plurality of second teeth to engage, until the moving piece moves to the second position.

11. A server comprising:

a chassis;

a sensor located on the chassis and configured for sensing a leak of coolant; and a joint module located on the chassis, the joint module comprising:

a shell defining a cavity;

a moving piece located in the cavity and movable along an axis of the moving piece between a first position and a second position;

a rotating piece located in the cavity and rotatable around an axis of the rotating piece between a first angle and a second angle, the axis of the rotating piece being parallel to the axis of the moving piece;

a driving piece located on the shell and configured for rotating the rotating piece; and a plug connector located on the moving piece and configured for connecting a plug, wherein when the sensor senses the leak of coolant in the chassis, the driving piece rotates the rotating piece from the first angle to the second angle, then the moving piece moves from the first position to the second position, the plug connector moves towards the shell and disconnects the plug.

12. The server of claim 11, wherein the shell comprises a base and a cover, the cover is removably installed on the base, the cavity is formed between the cover and the base, the base defines at least one groove parallel to the axis of the moving piece, the moving piece comprises at least one pin, each of the at least one pin is slidably located in each of the at least one groove.

13. The server of claim 11, wherein the moving piece comprises a plurality of first teeth, the rotating piece comprises a plurality of second teeth, when the moving piece is on the first position and the rotating piece is at the first angle, each of the plurality of first teeth is against each of the plurality of second teeth, when the moving piece is on the second position and the rotating piece is at the second angle, the plurality of first teeth and the plurality of second teeth are engaged.

14. The server of claim 13, wherein the moving piece further comprises a shaft and a head, the rotating piece further comprises a ring, the head is located on an end of the shaft in the cavity and is configured for connecting the plug, another end of the shaft away from the head passes through the ring, the ring rotates around the shaft between the first angle and the second angle, the plurality of first teeth are located on the head toward the ring, the plurality of second teeth are located on the ring towards the head.

15. The server of claim 14, wherein the rotating piece further comprises a trigger lever, the shell defines an avoiding hole, the trigger lever is located on the ring and extends along a radial direction of the ring out of the cavity through the avoiding hole, the driving piece comprises a pushing part, the pushing part is configured for pushing the trigger lever to rotate the ring from the first angle to the second angle.

16. The server of claim 15, wherein the driving piece further comprises a spring, the spring is located out of the cavity, the spring connects the trigger lever and the shell, the pushing part is configured for pushing the trigger lever to a critical angle between the first angle and the second angle, after the trigger lever is pushed at the critical angle, the spring pulls the trigger lever to rotate the ring from the critical angle to the second angle, the pushing part defines a bevel, the pushing part moves along the axis of the moving part, the bevel is configured for pushing the trigger lever during the movement of the pushing part, to push the trigger lever from the first angle to the critical angle.

17. A computing system comprising:

a rack comprising a plurality of plugs; and a plurality of servers placed in the rack, each of the plurality of servers comprising:

a chassis;

a sensor configured for sensing a leak of coolant; and a joint module located on the chassis, the joint module comprising:

a shell defining a cavity;

a moving piece located in the cavity and movable along an axis of the moving piece between a first position and a second position;

a rotating piece located in the cavity and rotatable around an axis of the rotating piece between a first angle and a second angle, the axis of the rotating piece being parallel to the axis of the moving piece;

a driving piece located on the shell and configured for rotating the rotating piece; and a plug connector located on the moving piece and configured for connecting one of the plurality of plugs, wherein when the sensor senses the leak of coolant in the chassis, the driving piece rotates the rotating piece from the first angle to the second angle, then the moving piece moves from the first position to the second position under a pressure of the coolant, the plug connector moves towards the shell and disconnects the one of the plurality of plugs.

18. The computing system of claim 17, wherein the moving piece comprises a plurality of first teeth, the rotating piece comprises a plurality of second teeth, when the moving piece is on the first position and the rotating piece is at the first angle, each of the plurality of first teeth is against each of the plurality of second teeth, when the moving piece is on the second position and the rotating piece is at the second angle, the plurality of first teeth and the plurality of second teeth are engaged.

19. The computing system of claim 18, wherein the moving piece further comprises a shaft and a head, the rotating piece further comprises a ring, the head is located on an end of the shaft in the cavity and is configured for connecting the plug, another end of the shaft away from the head passes through the ring, the ring rotates around the shaft between the first angle and the second angle, the plurality of first teeth are located on the head toward the ring, the plurality of second teeth are located on the ring towards the head.

20. The computing system of claim 19, wherein the rotating piece further comprises a trigger lever, the shell defines an avoiding hole, the trigger lever is located on the ring and extends along a radial direction of the ring out of the cavity through the avoiding hole, the driving piece comprises a pushing part and a spring, the spring is located out of the cavity, the spring connects the trigger lever and the shell, the pushing part is configured for pushing the trigger lever to a critical angle between the first angle and the second angle, after the trigger lever is pushed at the critical angle, the spring pulls the trigger lever to rotate the ring from the critical angle to the second angle, the pushing part defines a bevel, the pushing part moves along the axis of the moving part, the bevel is configured for pushing the trigger lever during the movement of the pushing part, to push the trigger lever from the first angle to the critical angle.

* * * * *